United States Patent [19]

Shell

[11] 4,012,263
[45] Mar. 15, 1977

[54] ALKALI-FREE GLASSES
[75] Inventor: James Allen Shell, Toledo, Ohio
[73] Assignee: Owens-Illinois, Inc., Toledo, Ohio
[22] Filed: Feb. 10, 1975
[21] Appl. No.: 548,264
[52] U.S. Cl. .............................................. 106/52
[51] Int. Cl.$^2$ ........................................ C03C 3/04
[58] Field of Search .................................. 106/52
[56] References Cited
UNITED STATES PATENTS

| | | | |
|---|---|---|---|
| 3,305,371 | 2/1967 | de Lajarte | 106/52 |
| 3,496,401 | 2/1970 | Dumbaugh | 106/52 |
| 3,562,184 | 2/1971 | Dodd | 106/52 |
| 3,578,470 | 5/1971 | Bahat et al. | 106/52 |
| 3,673,049 | 6/1972 | Giffen et al. | 106/52 |
| 3,837,978 | 9/1974 | Busdiecker | 106/52 |
| 3,840,394 | 10/1974 | Eppler | 106/52 |

OTHER PUBLICATIONS

Thomas, R. H., "Phase Equilibrium in a Portion of the Ternary System BaO–Al$_2$O$_3$–SiO$_2$," Journal American Ceramic Society, vol. 33, No. 2, 1950, pp. 35–44.

Primary Examiner—Patrick P. Garvin
Assistant Examiner—Mark Bell
Attorney, Agent, or Firm—Charles S. Lynch; E. J. Holler

[57] ABSTRACT

Glass compositions, free of alkali metal, are disclosed which are suitable for a wide variety of purposes, particularly in the electronics industry. The glasses have good working properties and resist uncontrolled devitrification. Characterized by low to moderate thermal expansion properties, the glass compositions generally contain the following components expressed as oxides in the indicated amounts based on the total weight of the composition:

| | |
|---|---|
| SiO$_2$ | 50–62 |
| Al$_2$O$_3$ | 8–15 | and at least one RO oxide as follows:

| | |
|---|---|
| CaO | 0–25 |
| BaO | 15.5–32 |
| MgO | 0–2.4 | and wherein the sum of the RO oxides is at least 23%.

12 Claims, No Drawings

ALKALI-FREE GLASSES

INTRODUCTION

This invention relates to low to moderate expansion glasses which have excellent glass working properties, superior glass quality and moderate thermal expansion characteristics generally greater than $45 \times 10^{-7}/^\circ$ C. and more particularly in the range of about 47 to about $68 \times 10^{-7}/^\circ$ C.

BACKGROUND OF THE INVENTION

In the semi-conductor field, and with particular reference to semi-conductor devices such as diodes and the like, including the silicon crystalline form of a wafer and electrical conductors connected to opposite sides of the wafer, it has been customary to employ glass for the encapsulation of such objects to protect them. The encapsulating glass is hermetically sealed to the electrical conductors to guard against harmful impurities including water vapor from the atmosphere. It has also been the practice to employ certain glass compositions for drawing into various shaped glass articles, as well as for sealing purposes. Various glass compositions have been devised in the past which have been satisfactory for the production of small glass containers. However, it has been observed that certain properties of these glasses have interfered with obtaining satisfactory sealing of these devices and, moreover, have deleteriously affected certain delicate electronic parts which have been packaged or sealed therein. An example of a deleterious effect is the so-called "poisoning" effect which glasses containing an alkali metal oxide have on electronic parts, and which prohibits the use of such glasses for packaging and sealing of these components.

In the sealing of various metal surfaces, it is of considerable importance that the sealing glass possess sufficient stability to resist uncontrolled devitrification in the course of sealing or during subsequent treatments of the sealed metal part. Undesirable devitrification may cause loss of seal strength and impart other complications leading to the deterioration of an adequate seal. Also, once the metal has been sealed, the glass should be resistant to chemical attack which may result from exposure to solvents, effect of water or other aqueous solutions or the general atmosphere.

Another important requisite in obtaining good sealing strength is that the sealing glasses possess a coefficient of thermal expansion that approximates as closely as possible that of the metal to which it is sealed. If the rates of thermal expansion are significantly different, a satisfactory bond may not be maintained upon cooling of the seal when first made. Even if initially satisfactory, the seal between the glass and the metal may fail later as a result of temperature fluctuations. Thus, in the past it has been particularly difficult to form adequate seals to molybdenum, alloys of molybdenum, iron-nickel-cobalt (KOVAR) alloys and similar alloys because many sealing glasses do not have the proper coefficient of thermal expansion. Consequently, there has developed in the art a need for sealing glasses which overcome the aforementioned disadvantages.

GENERAL DESCRIPTION OF THE INVENTION

The glass compositions of this invention can be used for a wide variety of purposes, illustratively, for the encapsulation and sealing of electronic equipment and for the formation of a variety of containers where superior chemical durability and high electrical resistivity is desirable or required.

The alkali-free glasses of this invention have working properties superior to representative glasses generally available. Significantly, these superior working properties are obtained without the use of $B_2O_3$ and consequently the glass quality of these compositions is improved since the instability and other known problems associated with the use of $B_2O_3$ are avoided.

Generally, the combination of excellent glass working properties and superior glass quality are obtained in compositions of this invention that have a thermal expansion characteristic greater than $50 \times 10^{-7}/^\circ$ C. However, the alkali-free glasses of this invention have coefficients of thermal expansion that range from about 47 to about $68 \times 10^{-7}/^\circ$ C.

The viscosity liquidus relationship for these glasses is sufficient to enable the glasses to satisfy the requirements for most glass forming operations. Thus, the glasses of this invention can be used in rapidly operating, commercial glass forming equipment and can be used to make tubing, sheets, beakers and the like. Because of their stability, the glasses can be drawn into tubing and rod with little or no problems of uncontrolled devitrification. The quality of these glasses is superior because they do not contain $B_2O_3$ which is a source of cords in similar compositions.

Broadly described, the glasses of this invention consist essentially of the chemical compositions $RO$-$R_2O_3$-$SiO_2$ in which the RO may be either BaO alone, or together with CaO and/or MgO. The $R_2O_3$ group will be basically $Al_2O_3$. These are the sole essential ingredients. Because of their unique combination of physical properties, the alkali-free glasses of this invention are beneficial for certain electronic and chemical applications. The advantageous properties include low to moderate thermal expansion, high chemical durability, high electrical resistivity and low dielectric losses. The glasses of the present invention have coefficients of thermal expansion which are generally higher than most alkali-free glasses but in a range which makes them particularly suitable for sealing to refractory metals such as tungsten and molybdenum.

In a more particular aspect of the invention, the alkali-free glasses, which are also lead-free, are thermally compatible with alumina and are particularly suitable for glazing alumina. Furthermore, these glasses can also be used as a substrate. One of the advantages of the glasses of the present invention is that they are more refractory than the other glasses currently in use as alumina glazes. For the fabrication of integrated circuits, this property permits the application of conducting and non-conducting films at higher temperatures than presently possible.

DETAILED DESCRIPTION OF INVENTION

According to the present invention, glass compositions are provided that contain no alkali metal oxide such as the sodium or potassium oxide usually present in prior art glass compositions and which have adversely affected certain sealed metal articles. Neither do the glasses contain lead oxide. These glass compositions, because of their excellent thermal characteristics are particularly suitable for sealing purposes including many applications to metals of moderate thermal expansion, such as molybdenum, various alloys of molybdenum, tungsten and the like. Because of the relationship of viscosity and liquidus temperature and improved chemical durability, the glasses of the present invention are excellent for fabrication of tubing. Thus, the glasses of this invention may be used for the sealing, packaging and encapsulation of electronic equipment.

Expressed in terms of oxide components based on the total composition, the glasses of the present invention consist essentially of, as the sole essential ingredients in percent by weight:

| | |
|---|---|
| $SiO_2$ | 50–62 |
| $Al_2O_3$ | 8–15 | and at least one RO oxide as follows:

| | |
|---|---|
| CaO | 0–25 |
| BaO | 15.5–32 |
| MgO | 0–2.4 | wherein the sum of the RO oxides is at least 23%. To facilitate comparison with other compositions, the following composition expresses the glasses of the invention in mole percent:

| | |
|---|---|
| $SiO_2$ | 64–75.9 |
| $Al_2O_3$ | 6–9.1 | and at least one RO oxide as follows:

| | |
|---|---|
| CaO | 0–26 |
| BaO | 7–16.4 |
| MgO | 0–4 | wherein the sum of the RO oxides is at least 16.4.

The glasses of the present invention have a fiber softening temperature within the range of from about 898° to 1008° C., and a strain point in the range of 672° to 733° C. Also, the coefficient of thermal expansion of the glasses of the present invention ranges from about 47 up to about $68 \times 10^{-7}/°$ C. over the range of 0° to 300° C.

In carrying out the sealing methods of the present invention, it has been found that it is unnecessary to prepare the surface of the metal such as molybdenum and its various alloys or tungsten and the like. The sealing glass is melted and coated over the metal surface to produce a good bond. In the alternative, the glass can be in powdered or frit form and coated on the surface of the metal to be sealed and thereafter the seal assembly exposed to an elevated temperature under suitable conditions employing either an oven or a furnace, e.g. infra-red heat, or the like which melts the glass powder and thereby seals the metal surface therewith. It is conventional to use a binder or solvent vehicle to make a frit paste to facilitate use and application to a surface to be sealed. Glass compositions of the present invention are particularly useful for the encapsulation of certain electrical circuits and parts where heretofore the sealing glasses containing potassium oxide and/or sodium oxide can deleteriously affect such sealed parts so as to make them unsatisfactory for the purposes intended.

The various components are expressed in terms of their oxides although in preparing the sealing glasses the components may be added in various forms. For obtaining compositions as defined herein, it will be necessary to take into account losses due to volatilization and the like. Thus, the compositions of the starting batch are adjusted accordingly. For the manufacture of the sealing glasses according to this invention, the batch can be prepared from the various ingredients commonly used in the art for providing the constituent oxides in the required amounts. For extremely high purity materials, organometallic methods or vapor phase methods can be used to keep the alkali metal content very low. For example, with special procedures, it is possible to reduce the alkali metal content to 50 parts per million or less.

According to a more particular embodiment of the invention, the glass compositions expressed on an oxide basis contain the following components in the indicated amounts:

| Component | Weight Percent | Mole Percent |
|---|---|---|
| $SiO_2$ | 57.4–62 | 64.9–75.9 |
| $Al_2O_3$ | 10–14.8 | 7.7–9.1 |
| and at least one of | | |
| BaO | 15.5–32 | 7–16.4 |
| CaO | 0–23.2 | 0–26 |
| MgO | 0–2.4 | 0–4 | and wherein the sum of RO oxides is at least 23% weight percent or 16.4 mole percent.

In another embodiment of the invention, the glass compositions contain both BaO and CaO as illustrated in the following table containing the indicated ingredients in the stated weight percent and mole percent:

| Component | Weight Percent | Mole Percent |
|---|---|---|
| $SiO_2$ | 50–52.1 | 64–65 |
| $Al_2O_3$ | 8–10.9 | 6–8 |
| CaO | 8.7–11.1 | 12–15 |
| BaO | 26.6–30.3 | 13–15 |
| the sum of RO (CaO + BaO) oxides at least | 37 | 27 |

Glasses coming within the scope of the foregoing more particular aspect of the invention have coefficients of thermal expansion in the range of 61.8 to $67.3 \times 10^{-7}/°$ C., softening points in the range of 898°–925° C., annealing points in the range of 719°–734° C. and strain points in the range of 672°–685° C.

These glasses described immediately above are particularly suitable for glazing of alumina and for the formation of substrates in the fabrication of integrated circuits.

The followng examples will serve to illustrate the present invention:

EXAMPLE I

The following batch was prepared:

| | |
|---|---|
| Ottawa Sand | 9,385 grams |
| A-14 Alumina | 1,801.52 |
| Calcium Carbonate | 2,418.60 |
| Barium Carbonate | 4,353.60 |

A glass was prepared from a melt of the above batch composition and had the following theoretical weight composition based on oxides:

|  | (Wt.%) | (Mole %) |
|---|---|---|
| $SiO_2$ | 58.99 | 71 |
| $Al_2O_3$ | 11.28 | 8 |
| CaO | 8.53 | 11 |
| BaO | 21.20 | 10 |

The strain point of the resulting glass was 703° C.
The annealing point was 757° C.
The softening point was 971° C.
The coefficient of thermal expansion from 0° to 300° C. was $51.7 \times 10^{-7}$/° C.
Liquidus temperature was 1125° C.
Log N (liq.) was 5.5.
The glass was found to be particularly suitable for sealing to molybdenum. Tubular glass seals were thermal shocked from 100° to 0° C. and vice versa without fracturing. The seals remained helium-leak tight after the preceding test.

EXAMPLE II

Using the following batch ingredients a glass composition was prepared:

| Kona Quintas Sand | 2872 grams |
|---|---|
| A-14 | 556 grams |
| Calcium Carbonate C.P. | 750 grams |
| Barium Carbonate C.P. | 1495 grams |

Expressed in terms of oxides, the glass had the following theoretical composition:

|  | (Wt.%) | (Mole %) |
|---|---|---|
| $SiO_2$ | 57.4 | 70 |
| $Al_2O_3$ | 11.1 | 8 |
| CaO | 8.4 | 11 |
| BaO | 23 | 11 |

The fiber softening point was determined as 965° C.
The annealing point was 752° C.
The strain point was 697° C.
Liquidus temperature, 2111° F. (1154° C.).
Log N (liq.), about 5.1.
Average coefficient of thermal expansion from 0° to 300° C. was $52.7 \times 10^{-7}$/° C.

EXAMPLE III

A glass composition was prepared having the following theoretical composition expressed as oxides based on the total weight of the composition:

|  | (Wt.%) | (Mole %) |
|---|---|---|
| $SiO_2$ | 59 | 71 |
| $Al_2O_3$ | 14.1 | 10 |
| CaO | 7.8 | 10 |
| BaO | 19.1 | 9 |

The following data was obtained:
Fiber softening point, 985° C.
Annealing point, 776° C.
Strain point, 733° C.
Coefficient of thermal expansion, $47.2 \times 10^{-7}$/° C. (0°–300° C.)
Log 4, 1313° C. (2395° F.).
Liquidus temperature, 1220° C. (2227° F.).
Log N (liq.), about 4.8

EXAMPLE IV

A glass composition was prepared using Ottawa Sand, A-14 Alumina, Calcium Carbonate and Barium Carbonate as the raw materials. The theoretical composition expressed in terms of oxides based on the total composition is:

|  | Weight Percent | Mole Percent |
|---|---|---|
| $SiO_2$ | 58.6 | 71 |
| $Al_2O_3$ | 12.6 | 9 |
| CaO | 7.7 | 10 |
| BaO | 21.1 | 10 |

The following physical property data was obtained:
Average coefficient of thermal expansion, $50.3 \times 10^{-7}$/° C. (0°–300° C.).
Annealing point, 765° C.
Fiber softening point, 990° C.
Strain point 710° C.
Log 4, 1310° C. (2390° F.).
Liquidus, 1172° C. (2141° F.).
Log N (liq.), about 5.2.

EXAMPLE V

Using the indicated batch ingredients:

| Ottawa Sand | 2643 grams |
|---|---|
| A-14 Alumina | 547.50 grams |
| Calcium Carbonate C.P. | 866 grams |
| Barium Carbonate C.P. | 1729 grams | a glass composition was prepared having the following theoretical composition expressed in terms of oxides based on total composition is:

|  | Weight Percent | Mole Percent |
|---|---|---|
| $SiO_2$ | 52.8 | 66 |
| $Al_2O_3$ | 10.9 | 8 |
| CaO | 9.7 | 13 |
| BaO | 26.6 | 13 |

The following physical property data was obtained:

| Fiber softening point | 929° C. |
|---|---|
| Annealing point | 737° C. |
| Strain point | 688° C. |
| Average Coefficient of Thermal Expansion (0–300° C.) | $60.7 \times 10^{-7}$/° C. |
| Liquidus, 1182° C. (2160° F.) | |
| Log N (liq.), about 4.3. | |

EXAMPLE VI

The following composition was prepared wherein the indicated ingredients expressed as oxides are present in the indicated amounts:

|  | Wt.% | Mole % |
|---|---|---|
| $SiO_2$ | 58 | 75.9 |
| $Al_2O_3$ | 10 | 7.7 |
| BaO | 32 | 16.4 |

Coefficient of thermal expansion (0–300° C.) 49.4 × $10^{-7}$ /° C.
Fiber softening point 1008° C.
Annealing point 768° C.
Strain point 710° C.

EXAMPLE VII

The following composition was prepared wherein the indicated ingredients expressed as oxides are present in the indicated amounts based on the total composition:

|  | Wt.% | Mole % |
|---|---|---|
| $SiO_2$ | 56.5 | 66 |
| $Al_2O_3$ | 11.6 | 8 |
| CaO | 14.4 | 18 |
| BaO | 17.5 | 8 |

Coefficient of thermal expansion (0–300° C.) 57.4 × $10^{-7}$ /° C.
Fiber softening point 936° C.
Annealing point 741° C.
Strain point 694° C.

EXAMPLE VIII

The following composition was prepared wherein the indicated ingredients expressed as oxides are present based on the total composition:

|  | Wt.% | Mole % |
|---|---|---|
| $SiO_2$ | 59 | 68 |
| $Al_2O_3$ | 11.8 | 8 |
| CaO | 13.8 | 17 |
| BaO | 15.5 | 7 |

Coefficient of thermal expansion 54.5 × $10^{-7}$ /° C.
Fiber softening point 948° C.
Annealing point 750° C.
Strain point 699° C.
Liquidus 1193° C.
Log N (liq.) about 4.4

EXAMPLE IX

The following composition was prepared wherein the indicated ingredients expressed as oxides are present based on the total composition:

|  | Wt.% | Mole % |
|---|---|---|
| $SiO_2$ | 57.8 | 66 |
| $Al_2O_3$ | 11.9 | 8 |
| CaO | 12.3 | 15 |
| BaO | 15.7 | 7 |
| MgO | 2.4 | 4 |

Coefficient of thermal expansion (0–300° C.) 53.8 × $10^{-7}$ /° C.
Fiber softening point 935° C.
Annealing point 738° C.
Strain point 689° C.
Liquidus 1166° C. (2130° F.)
Log N (liq.) about 4.5

EXAMPLE X

The following composition was prepared wherein the indicated ingredients expressed as oxides are present based on the total composition:

|  | Wt.% | Mole % |
|---|---|---|
| $SiO_2$ | 58.7 | 67 |
| $Al_2O_3$ | 11.9 | 8 |
| CaO | 11.4 | 14 |
| BaO | 15.6 | 7 |
| MgO | 2.4 | 4 |

Coefficient of thermal expansion (0–300° C.) 52.3 × $10^{-7}$ /° C.
Fiber softening point 956° C.
Annealing point 743° C.
Strain point 692° C.
Liquidus 1168° C. (2135° F.)
Log N (liq.) about 4.7

It is understood that various other modifications will be apparent to and can readily be made by those skilled in the art without departing from the scope and spirit of this invention. Accordingly, it is not intended that the scope of the claims appended hereto be limited to the description set forth herein but rather that the claims be construed as encompassing all the features of patentable novelty which reside in the present invention including all features which would be treated as equivalents thereof by those skilled in the art to which the invention pertains.

What is claimed is:

1. A glass composition containing $SiO_2$, $Al_2O_3$, CaO and BaO and consisting essentially of compositions selected alternatively from one of the group of compositional ranges A and B below:

| COMPOSITIONAL RANGE A | |
|---|---|
| COMPONENTS | PERCENT BY WEIGHT |
| $SiO_2$ | 50–52.1 |
| $Al_2O_3$ | 8–10.9 |
| CaO | 8.7–11.1 |
| BaO | 26.6–30.3 |

| COMPOSITIONAL RANGE B | |
|---|---|
| COMPONENTS | PERCENT BY WEIGHT |
| $SiO_2$ | 52.8–59 |
| $Al_2O_3$ | 10.9–14.1 |
| CaO | 7.7–14.4 |
| BaO | 15.5–26.6 |
| MgO | 0–2.4 |

2. A glass composition containing as the sole essential constituents the following components in the indicated amounts based on the total composition in percent by weight:

| $SiO_2$ | 50–52.1 |
|---|---|
| $Al_2O_3$ | 8–10.9 |
| CaO | 8.7–11.1 |
| BaO | 26.6–30.3 | wherein the sum of CaO + BaO is at least 37%.

3. A glass composition containing as the sole essential constituents the following components in the indicated amounts based on the total composition in percent by weight:

| $SiO_2$ | 52.8–59 |
|---|---|
| $Al_2O_3$ | 10.9–14.1 |

-continued

|     |           |
| --- | --------- |
| CaO | 7.7–14.4  |
| BaO | 15.5–26.6 |
| MgO | 0–2.4     |

4. A glass composition as defined in claim 3, wherein said glass composition in percent by weight consists essentially of:

|           |       |
| --------- | ----- |
| $SiO_2$   | 58.99 |
| $Al_2O_3$ | 11.28 |
| CaO       | 8.53  |
| BaO       | 21.20 |

5. A glass composition as defined in claim 3, wherein said glass composition in percent by weight consists essentially of:

|           |      |
| --------- | ---- |
| $SiO_2$   | 57.4 |
| $Al_2O_3$ | 11.1 |
| CaO       | 8.4  |
| BaO       | 23   |

6. A glass composition as defined in claim 3, wherein said glass composition in percent by weight consists essentially of:

|           |      |
| --------- | ---- |
| $SiO_2$   | 59   |
| $Al_2O_3$ | 14.1 |
| CaO       | 7.8  |
| BaO       | 19.1 |

7. A glass composition as defined in claim 3, wherein said glass composition in percent by weight consists essentially of:

|           |      |
| --------- | ---- |
| $SiO_2$   | 58.6 |
| $Al_2O_3$ | 12.6 |
| CaO       | 7.7  |
| BaO       | 21.1 |

8. A glass composition as defined in claim 3, wherein said glass composition in percent by weight consists essentially of:

|           |      |
| --------- | ---- |
| $SiO_2$   | 52.8 |
| $Al_2O_3$ | 10.9 |
| CaO       | 9.7  |
| BaO       | 26.6 |

9. A glass composition as defined in claim 3, wherein said glass composition in percent by weight consists essentially of:

|           |      |
| --------- | ---- |
| $SiO_2$   | 56.5 |
| $Al_2O_3$ | 11.6 |
| CaO       | 14.4 |
| BaO       | 17.5 |

10. A glass composition as defined in claim 3, wherein said glass composition in percent by weight consists essentially of:

|           |      |
| --------- | ---- |
| $SiO_2$   | 59   |
| $Al_2O_3$ | 11.8 |
| CaO       | 13.8 |
| BaO       | 15.5 |

11. A glass composition as defined in claim 3, wherein said glass composition in percent by weight consists essentially of:

|           |      |
| --------- | ---- |
| $SiO_2$   | 57.8 |
| $Al_2O_3$ | 11.9 |
| CaO       | 12.3 |
| BaO       | 15.7 |
| MgO       | 2.4  |

12. A glass composition as defined in claim 3, wherein said glass composition in percent by weight consists essentially of:

|           |      |
| --------- | ---- |
| $SiO_2$   | 58.7 |
| $Al_2O_3$ | 11.9 |
| CaO       | 11.4 |
| BaO       | 15.6 |
| MgO       | 2.4  |

* * * * *